(12) United States Patent
Camp

(10) Patent No.: US 9,683,817 B1
(45) Date of Patent: Jun. 20, 2017

(54) DETECTION AND DETONATION OF IMPROVISED EXPLOSIVE DEVICE WITH MAGNETIC FIELDS

(71) Applicant: James Thomas Camp, Colonial Beach, VA (US)

(72) Inventor: James Thomas Camp, Colonial Beach, VA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/718,066

(22) Filed: May 20, 2015

Related U.S. Application Data

(63) Continuation-in-part of application No. 14/055,837, filed on Oct. 16, 2013, now Pat. No. 9,300,280.

(51) Int. Cl.
| | |
|---|---|
| *H03K 3/00* | (2006.01) |
| *F41H 11/136* | (2011.01) |
| *H02J 1/06* | (2006.01) |
| *H03K 3/53* | (2006.01) |
| *H03K 3/537* | (2006.01) |
| *G01V 3/10* | (2006.01) |
| *F41H 11/32* | (2011.01) |

(52) U.S. Cl.
CPC ........... *F41H 11/136* (2013.01); *F41H 11/32* (2013.01); *G01V 3/101* (2013.01); *H02J 1/06* (2013.01); *H03K 3/53* (2013.01); *H03K 3/537* (2013.01)

(58) Field of Classification Search
CPC .............................. F41H 11/136; G01V 3/101
See application file for complete search history.

(56) References Cited

U.S. PATENT DOCUMENTS

| | | | |
|---|---|---|---|
| 5,008,798 A | 4/1991 | Harvey | 363/59 |
| 5,151,663 A | 9/1992 | Harvey | 330/41 |
| 7,775,146 B1* | 8/2010 | Bitar | F41H 11/12 |
| | | | 102/403 |

(Continued)

OTHER PUBLICATIONS

Casey et al., "Solid-State Marx Bank Modulator for the Next Linear Collider", EPAC 2004, http://www.researchgato.net/publication/ 4062009_Solid-state_Marx_bank_modulmor_for_the_next_ linear..collider%2Pfile%2F99cfd5086f2c85d4eb.pdf.

*Primary Examiner* — Daniel Cavallari
(74) *Attorney, Agent, or Firm* — Gerhard W. Thielman, Esq.

(57) ABSTRACT

A magnetic coupling (MC) circuit is provided for detecting an obscured object. The MC circuit connects to a current measuring instrument and includes a Marx bank having a plurality of stages; a peaking circuit; and an induction loop. Each stage of the Marx bank includes a resistor-capacitor (RC) loop having a first resistor connecting to a breakdown circuit. The Marx bank connects to a fixed potential known as ground. The breakdown circuit includes a breakdown switch, a second resistor and a bank capacitor. The voltage source connects to the Marx bank. The peaking circuit includes a peaking inductor, a peaking capacitor and a peaking switch disposed in parallel. The peaking switch connects the Marx bank to the peaking capacitor. The induction loop includes an impedance inductor connecting to the peaking switch. The instrument measures a first current in absence of the object and a second current in presence of the object, and detects the object based on difference between the first and second currents.

7 Claims, 4 Drawing Sheets

(56) References Cited

U.S. PATENT DOCUMENTS

| | | | |
|---|---|---|---|
| 7,987,760 B1* | 8/2011 | Lundquist | F41H 11/12 |
| | | | 86/50 |
| 8,683,907 B1* | 4/2014 | Howe | F41H 11/32 |
| | | | 102/402 |
| 2008/0156219 A1* | 7/2008 | Voss | F41H 13/0025 |
| | | | 102/402 |
| 2012/0073426 A1* | 3/2012 | Adler | F41H 11/16 |
| | | | 89/1.13 |
| 2015/0102690 A1 | 4/2015 | Camp | H02J 1/06 |

* cited by examiner

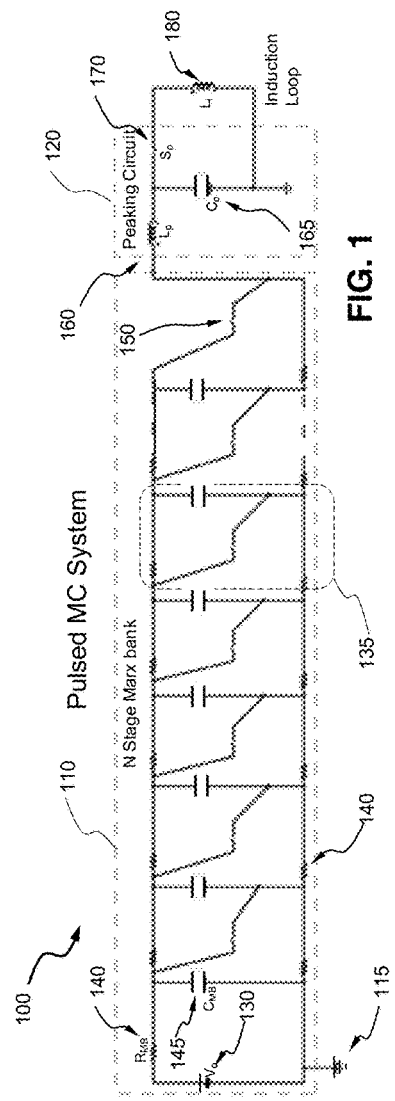
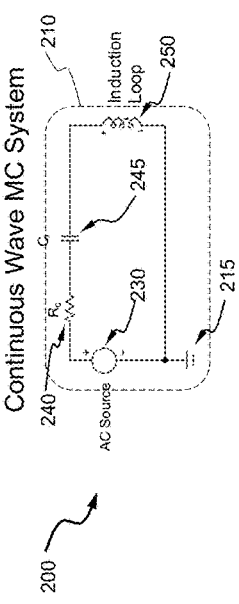
FIG. 1
FIG. 2

DETECTION AND DETONATION OF IMPROVISED EXPLOSIVE DEVICE WITH MAGNETIC FIELDS

CROSS REFERENCE TO RELATED APPLICATION

The invention is a Continuation-in-Part, claims priority to and incorporates by reference in Its entirety U.S. patent application Ser. No. 14/055,837 filed Oct. 16, 2013 and assigned Navy Case 102751.

STATEMENT OF GOVERNMENT INTEREST

The Invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to detecting and pre-detonating buried an Improvised explosive device (IED) by inductively coupling energy from an energy source into the IED, whether continuous wave (CW) or pulsed, with time-varying magnetic fields.

Military personnel may be assigned to patrol regions where hostile combatants operate. Concealed ordnance, e.g., landmine, IED, present a severe hazard of injury and/or death in such reconnaissance roles. The difficulty in identifying, locating and neutralizing such objects from a safe distance hampers efforts to pacify these territories by elevating risk to travelers (especially those on patrol) well above acceptable levels.

SUMMARY

Conventional IED detection systems yield disadvantages addressed by various exemplary embodiments of the present invention. In particular, various exemplary embodiments provide a magnetic coupling (MC) circuit for detecting an obscured object. The MC circuit connects to a current measuring instrument and includes a Marx bank having a plurality of stages; a peaking circuit; and an induction loop. Each stage of the Marx bank includes a resistor-capacitor (RC) loop having a first resistor connecting to a breakdown circuit. The Marx bank connects to a fixed potential known as ground. The breakdown circuit includes a breakdown switch, a second resistor and a bank capacitor. The voltage source connects to the Marx bank. The peaking circuit includes a peaking inductor, a pelking capacitor and a peaking switch disposed in parallel. The peaking switch connects to the Marx bank. The Induction loop includes an impedance inductor connecting to the peaking switch. The instrument measures a first current in absence of the object and a second current in presence of the object, and detects the object based on difference between the first and second currents. In various exemplary embodiments, the source can be pulse direct current or else alternating current. In alternate embodiments, the peaking circuit can contain a plurality of peaking inductor-capacitor pairs in order to generate multiple frequencies.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which:

FIG. 1 is a circuit diagram view of a magnetic coupling (MC) circuit with a pulse source;

FIG. 2 is a circuit diagram view of an MC circuit with an alternating current (AC) source;

FIG. 8 is a graphical view of power spectrum of the induced current into an IED target required for pre-detonation.

DETAILED-DESCRIPTION

Figure 3:
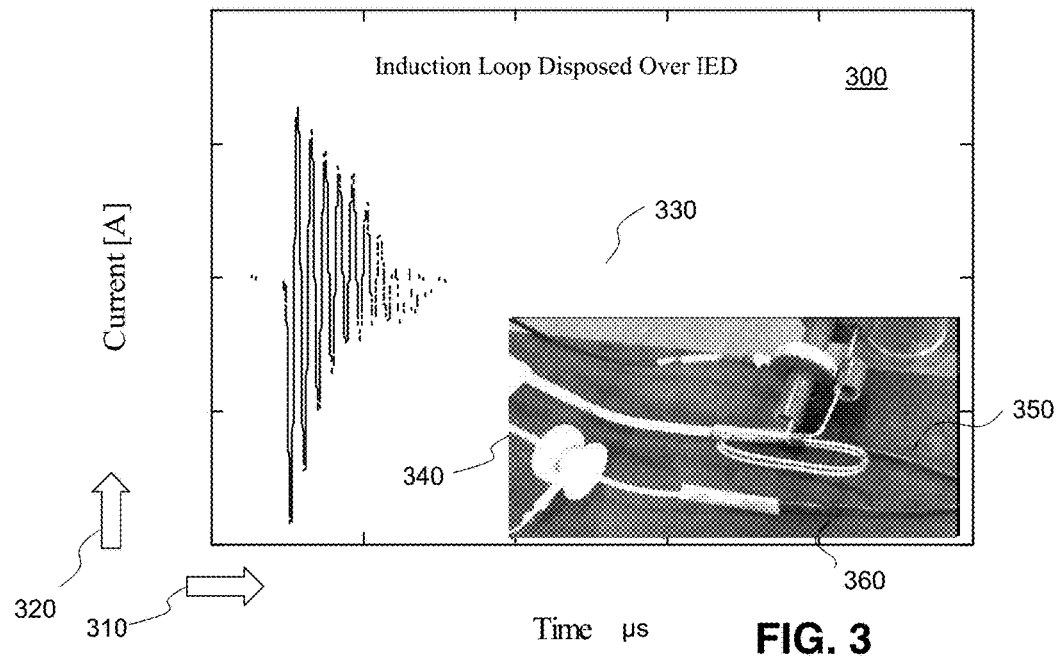
FIG. 3 is a graphical view of transient current of an MC circuit matched to a natural frequency.

In the following detailed description of exemplary embodiments of the Invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

In accordance with a presently preferred embodiment of the present invention, the components, process steps, and/or data structures may be implemented using various types of operating systems, computing platforms, computer programs, and/or general purpose machines. In addition, those of ordinary skill in the art will readily recognize that devices of a less general purpose nature, such as hardwired devices, or the like, may also be used without departing from the scope and spirit of the inventive concepts disclosed herewith. General purpose machines include devices that execute instruction code. A hardwired device may constitute an application specific integrated circuit (ASIC) or a field-programmable gate array (FPGA) or other related component.

In various exemplary embodiments, either a continuous wave (CW) voltage source using alternating current (AC), or a pulsed voltage source can be incorporated to move current in a coil of wire, which generates a magnetic field in the vicinity of the coil. Disposing the coil over an electrically closed circuit current that induces a magnetic field into the circuit through inductive coupling, called a magnetic coupling (MC) system. Such current above a threshold power level passing adjacent an IED triggers its initiator, destroying the device on command.

The current coupling can be detected by measuring the current through the wire coil, thus achieving the IED's detection. The IED pre-detonates in response to energy above its triggering threshold being induced into the closed circuit that includes the IED. The MC system can be specially designed to distinguish the effects of detection without detonation and detection through detonation.

Depending on power source, the MC system can be a hand held device, placed on an autonomous vehicle, or mounted to a manned vehicle.

The inventor initially began exploring the use of magnetic fields (B-fields) to defeat IEDs as part of a larger study, which was conducted to gain a better understanding of the underlying effects of electrostatic discharge (ESD) systems such as Tarantula, developed by Xtreme Alternatives Defense System (XADS) in Anderson, Ind., and Black Widow, developed by NSWC Panama City in Panama City, Fla. These efforts included deriving a theoretical analysis of an electric coupling (EC) mechanism between a pressure plate IED target and the high voltage emitters associated with Tarantula-like systems. The results from small-scale experiments reinforced the theoretical analysis and were later confirmed by full-scale experiments. Specifically, soil in which the target is buried constitutes one of the most significant limiting factors in inducing energy into the IED target with ESD systems.

The depth of effectiveness for an ESD system depends on the electric field strength within the sol, which can vary significantly in relation to the soil's compactness and moisture content. The arc, from the electrical breakdown between the emitters and the target, absorbs some energy due to its own resistance, thus decreasing the amount of energy delivered to the target. The amount of energy dissipated within the arc depends primarily on the burial depth and soil conditions, e.g., moisture content and compactness. Therefore, the energy transfer efficiency ETE (ratio of energy induced into the target with the stored energy) and the depth of effectiveness of ESD systems are directly dependent on soil conditions.

The exemplary MC system introduced during the full-scale study avoids such a dependency on soil conditions because of it employs magnetic fields rather than electric fields as in a conventional EC system. With magnetic fields, the energy is induced into the target through inductive coupling, which does not require electrical conducting or arcing contact in order to transfer energy. Most soils, whether completely dry or water-saturated, maintains a relative permeability of unity, thus enabling magnetic fields to penetrate readily into the soil irrespective of its moisture content or compactness.

Experimental results from the small-scale study as well as the subsequent full-scale demonstration in which a container of water was placed between an IED surrogate target and the induction loop that generates magnetic field confirmed this theory. The current induced into the target with nothing placed between the induction loop and target (air) was identical to the induced current with an inch of water placed between the loop and target. The depth of effectiveness's independent of changing soil conditions. Because no energy is lost within the soil, the ETE for a magnetic field system can be higher than that of an ESD system, thus enabling the magnetic field system to be smaller and lighter than direct injection systems.

The inventor conducted a full-scale study to verify the theoretical analysis derived during the email-scale study for inductive coupling with magnetic fields. The analysis was limited to a transmission model in which the length of the transmission line (IED wire length) was less than a quarter wavelength of the applied magnetic field. The study was also limited to low storage energy (0.2 J). The exemplary MC system is comprised of a 7-stage Marx bank, a peaking circuit, and an induction loop. Alternative numbers of stages of the Marx bank and peaking circuit can be contemplated without departing from the scope of the Invention, as would be recognized by artisans of ordinary skill.

The experimental results showed good agreement with the derived model. Using the experimental results in conjunction with the theoretical analysis, a relationship was derived to predict the behavior of a "tuned" system at full-scale. This disclosure defines the term "tuned" as the natural frequency of the MC system that involves oscillation of magnetic field equaling the resonance frequency of an IED target. When the MC system is tuned with the target, the maximum ETE occurs, resulting in the most energy being coupled into the target. An untuned system can be effective against an IED when the IED's natural harmonic is within the frequency range between $f_{low}$ and $f_{high}$. The frequency range can be increased by raising the coupling coefficient between the magnetic field producing loop of the system and the buried IED, as well as the stored energy.

The full-scale study also explored application of IED detection with magnetic fields. In this application, the energy induced into the target decreases the dissipated energy in the MC system, causing a change in the current trace measured at the induction loop. This change can readily be detected in the frequency domain. Without a target, the frequency domain of the current within the induction loop remains constant. When a target's natural frequency equals the frequency of the applied magnetic field, the frequency domain decreases at that specific frequency due to the transfer of energy from the magnetic field to the target.

Even when the targets natural frequency does not match the frequency of the applied magnetic field, a change in the frequency domain nonetheless occurs provided sufficient energy exists within the magnetic field at that specific frequency. Although experiments were conducted with a pulsed power source, the MC system can be operated with a continuous wave (CW) AC source. The next wave of experiments will include an AC energy source to be compared to a pulsed energy source.

FIG. 1 shows an electrical schematic diagram view 100 of a magnetic coupling (MC) system with a pulse source. The system includes an N-stage Marx bank 110 with a ground 115 and a peaking circuit 120. The Marx bank 110 is powered by a direct current (DC) voltage source 130 having potential $V_0$, and includes concatenated Marx circuits 135 in parallel. The Marx bank 110 includes reactance devices typically assigned to resistors and alternatively to inductors, each measured in ohms (Ω). Each Marx circuit 135 includes first and second resistors 140 each having resistance $R_{MB}$, a capacitor 145 having capacitance $C_{MB}$ and a switch 150.

The peaking circuit 120 includes an inductor 160 having an Inductance of $L_p$, a capacitor 165 having a capacitance of $C_p$ and a switch 170. The inductor 160 and capacitor 165 represent a peaking LC pair. Although only a single pair is shown, the peaking circuit 120 can include a concatenated plurality of such LC pairs. The peaking circuit 120 connects an Induction loop that connects the switch 170 in parallel with an inductor 180 having an Inductance of $L_i$. The charging resistors 140 of the Marx bank 110 can alternatively be substituted with charging inductors. The peaking circuit 120 can contain multiple pairs of charging inductance by inductor 160 and peaking capacitance by capacitor 166.

FIG. 2 shows an electrical schematic diagram view 200 of an MC system 210 connected to ground 215 and powered by an alternating current (AC) source 230. The AC system 210 includes a resistor 240 having resistance $R_c$, a capacitor 246 having a capacitance of $C_t$ and an induction loop 250 connected in series between the source 230 and ground 215.

Both the pulsed source shown in view 100 and the CW source shown in view 200 have been empirically evaluated. The pulse generator was designed to create an oscillating current whose frequency matched the resonance frequency of the target (surrogate IED in this case). Typically, this is accomplished by designing a shorted Marx bank whose erected capacitance and Inductance of the short circuit (induction loop in this case) result in the desired natural frequency. A shorted Marx bank has two distinct disadvantages in the case of magnetic induction: The first is the efficiency of a Marx bank decreases with a decrease in stored energy.

The decay time of 2L/R of a shorted Marx bank, where L is inductance and R is resistance, depends on the series resistance of the erected resistance-inductance-capacitance (RLC) Marx bank circuit, and the plasma channels of the spark gap switches become highly resistive the less the stored energy. Energy is required to expand the channel of a breakdown arc. The less energy there is, the less the arc expands, thus resulting in a more resistive breakdown channel. The second disadvantage of a shorted Marx bank is the frequency can only be varied by adjusting the inductance of the shorted loop, or induction loop in this case. The shape of the loop not only determines the natural frequency of the Marx bank, but it also determines the coupling coefficient between the loop and the target, or the IED in this case. For an optimum geometry of the loop (hence maximum inductance), maintaining the geometry of the loop despite changes in frequency remains an objective.

A solution to both these disadvantages is to incorporate a peaking circuit 120, which engages in inductive charging between the concatenated capacitance $C_{MB}/N$ of the erected Marx bank circuit 110 having N stages, and the capacitance $C_p$ of the peaking circuit 120 through its inductance $L_p$ 160. Ideally, upon saturation of the peak capacitor 165 in $C_p$, the peaking switch 170 closes creating a series RLC circuit between peaking circuit capacitance $C_p$, loop inductance $L_l$, and the resistance of peak switch $S_p$.

The N-stage Marx bank charges the peaking circuit, which historically has defined the output frequency of the pulse through the induction loop, i.e., the CW MC system. The series resistance of the circuit is represented by $R_c$, and the tuning capacitance is represented by $C_t$. Tuning $C_t$ such that the resonance frequency of the LC circuit matches the frequency of the AC source enables an amplification of current through the induction loop, thus increasing the magnetic field strength.

The resistance of the new RLC circuit arises from only a single switch instead of a series of switches. The frequency of the current in the induction loop 120 now depends on $C_p$ rather than $C_{MB}/N$. Consequently, changing the frequency without changing the induction loop requires the adjustment of one capacitor $C_p$ opposed to N capacitors $C_{MB}$. Multiple frequencies can be achieved by a plurality of peak-inductor-capacitor $L_p$ $C_p$ pairs. The peak switch $S_p$ is pressurized to preclude breakdown until $C_p$ is fully charged. With energy remaining stored in the Marx bank when $S_p$ doses, a current with a frequency defined by the erected Marx bank capacitance and the peaking inductor superimposes with the current from the peaking capacitance in the induction loop, combining their effects.

For view 200, the pulsed embodiment Marx bank 110 and peaking switch 170 can be replaced with a CW AC source that can readily be tuned or provide a necessary frequency sweep. The pulsed system has an advantage of delivering higher power. By contrast, the CW system has an advantage of continuously supplying current to the induction loop, but at a much lower power level. This disclosure discusses the pulsed embodiment, but artisans of ordinary skill will understand that an AC source can be used as well.

Exemplary CW values against an example IED of about 100 kg would include Marx bank capacitance $C_{MB}$ at 0.01 micro-farads (µF) for N=7 stages, peak capacitance $C_p$ at 1.43 nanofarads (nF), tuning capacitance $C_t$ of 0.03 nF, series resistance $R_c$ at 5 ohms (Ω), switch resistance of 2Ω, current flow of 2 amperes (A), source potential $V_0$ of 30 kilo-volts (kV), loop inductance $L_q$ of 3 micro-henrys (µH). For an exemplary pulsed system, current flow would be on the order of one kilo-ampere (1 kA).

FIG. 3 shows a graphical view 300 of current in an induction loop diepoeod over an IED with the MC system matched to the natural frequency of the IED. The abscissa is denoted by time 310 in microseconds, and the ordinate is denoted by current 320 in amperes. The plot features a dampening oscillating signal 330 with higher frequency ringing that dissipates to a residual level. An insert image 340 shows the current sensors 350 used to measure the current through the induction loop 350 and the current induced in the command wires 360 of the IED.

Figure 4:
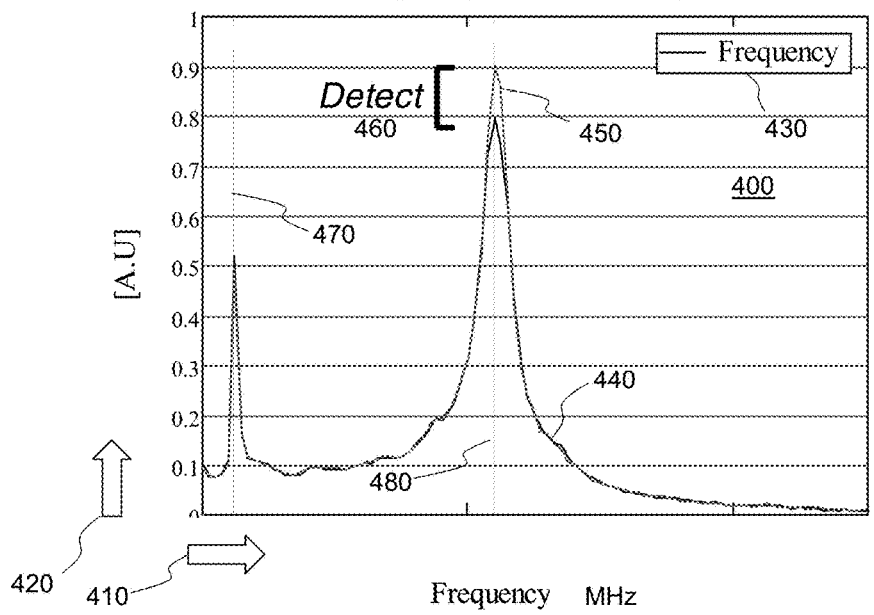
FIG. 4 is a graphical view of power spectrum of the MC circuit matched to a natural frequency.

FIG. 4 shows a graphical view 400 of signal frequency domain for the MC system matched to the natural frequency. The abscissa is denoted by frequency 410 in mega-hertz (MHz) and the ordinate is denoted by power 420 in arbitrary units (AU). A legend 430 identifies the solid line 440 as natural frequency of the MC system, whereas the dash fine 450 is natural frequency of the MC system in the presence of the IED, with a detection difference 460 to enable the IED's presence to be identified. The frequency response 440 includes the natural frequency 470 of the Marx bank and the natural frequency 480 of both the peaking circuit and IED together, with detection 480 corresponding to the natural frequency 480.

Figure 5:
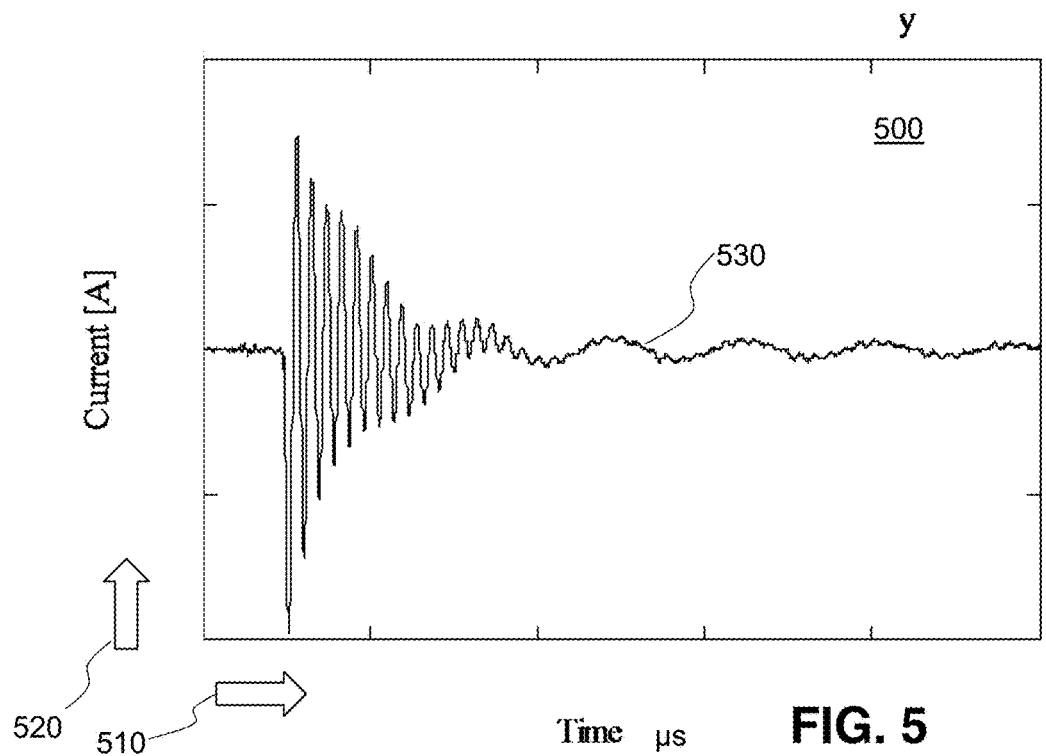
FIG. 5 is a graphical view of transient current of an MC circuit unmatched to a natural frequency.

FIG. 5 shows a graphical view 500 of current in an Induction loop disposed over an IED with the MC system unmatched to the natural frequency. The abscissa is denoted by time 510 in microseconds, and the ordinate is denoted by current 520 in amperes. The plot features a dampening oscillating signal 530 with higher frequency ringing that dissipates to a residual level.

Figure 6:
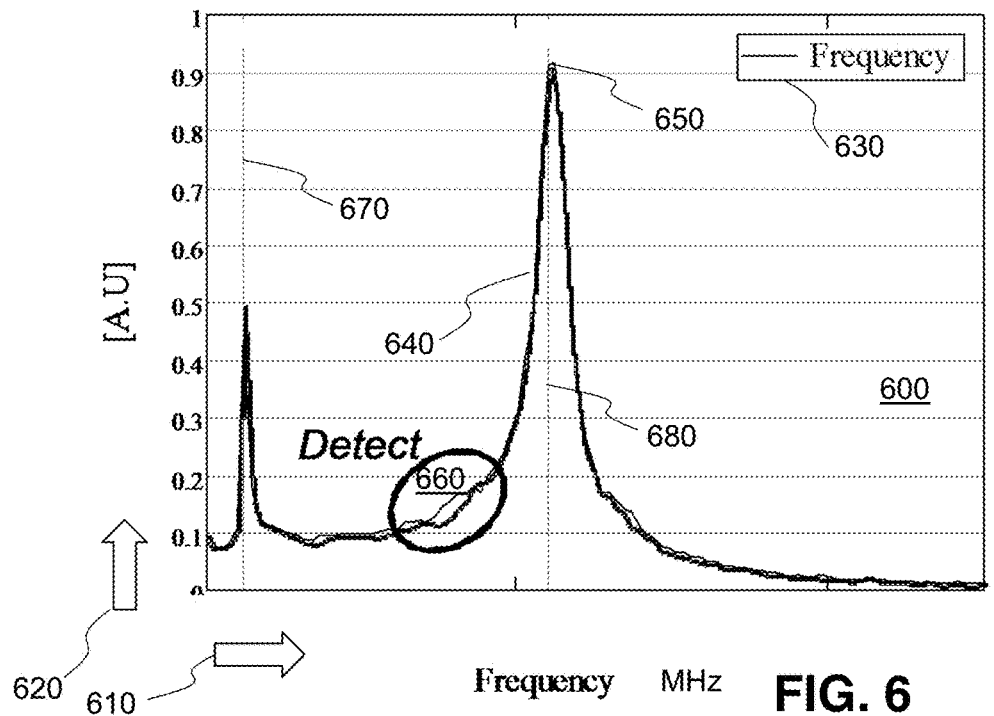

FIG. 6 shows a graphical view 600 of signal frequency domain for the unmatched MC system. The abscissa is denoted by frequency 610 in megahertz and the ordinate is denoted by power 620 in AU. A legend 630 identifies the solid line 640 as natural frequency of the unmatched MC system, whereas the dash line 650 is natural frequency of the unmatched MC system in the presence of the IED, with a detection difference 660 to enable the IED's presence to be identified at a frequency separate from either the natural frequency resonances.

Figure 7:
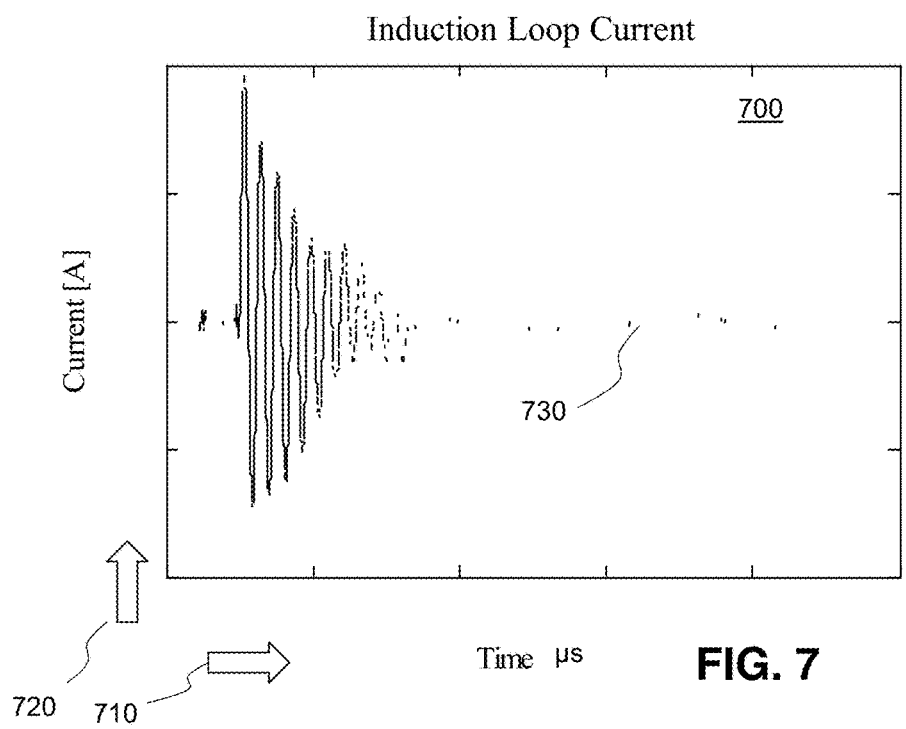
FIG. 7 is a graphical view of transient current of the MC circuit for pre-detonation.

FIG. 7 shows a graphical view 700 of Induction loop current for pre-detonation. The abscissa is denoted by time 710 in microseconds, and the ordinate is denoted by induced current 720 in amperes.

Figure 8:
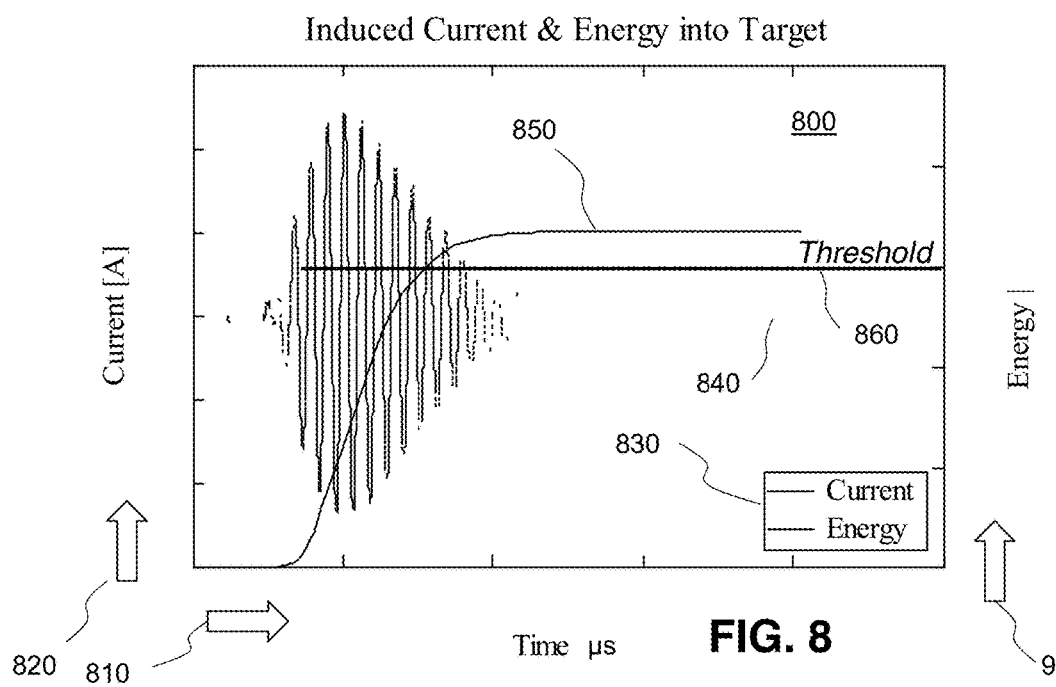
FIG. 8 is a graphical view of power spectrum of the MC circuit unmatched to a natural frequency.

FIG. 8 shows a graphical view 800 of induction induced current and energy entering a target. The abscissa is denoted by time 810 in microseconds, the left ordinate is denoted by current 820 in amperes and the right ordinate 825 is denoted by energy (depicted non-dimensionally without watts). A legend 830 identifies oscillating curve 840 for current and smooth curve 850 for energy. A threshold level 860 indicates energy needed to command pre-detonation.

A change in the frequency domain still occurs even when the frequency of the MC system does not match the natural frequency of the IED. In this case, a change in the frequency domain occurs at the natural frequency of. the IED, as shown in graphical views 500 and 600. Pre-detonation occurs when the induced energy in the IED increases above its threshold needed to pre-detonate the energetic material in the IED. View 700 shows the current through the induction loop of the MC system, and view 800 shows the induced current measured in the surrogate IED.

Conventional systems and exemplary embodiments provide detection with pro-detonation. However, the exemplary embodiments enable limiting the system's average output power to acceptable thresholds. In the absence of the target, the pulse shape at the output of the Marx bank is generally over-damped. When breakdown occurs from the emitters to the target, the load of the Marx bank is ideally shorted, creating an under-damped pulse at the output of the Marx bank.

For the conventional ESD system, target detection in the presence of the IED is determined by monitoring the output pulse of the Marx bank (i.e., over-damped pulse=no target, under-damped pulse=target). In favorable conditions (e.g., dry soil, shallow targets), this is a very sound approach. However, the ESD approach faces difficult challenges with varying soil conditions and deeply buried targets. For example, the output voltage of the Marx bank in the ESD without the target varies depending on the properties of the soil. Damper soil results in more severe oscillations, thereby rendering the detection method difficult to distinguish between a target and wet soil.

Most of the challenges are for deeper laying targets at a reduced energy. For the purpose of detection to reduce the average power, the energy per pulse of the ESD system must decrease. This can be achieved by decreasing the input voltage and stage capacitance of the Marx bank. However, reducing the voltage directly affects the maximum depth at which a target can be detected and/or neutralized. Therefore, the remaining option for decreasing the stored energy in the ESD system is to diminish the stage capacitance of the Marx bank. Decreasing the capacitance also has adverse effects for reaching penetration depth. A capacitance reduction decreases the RC decay constant of the Marx bank. Breakdown time intervals (on the order of µs) are then needed for deeply buried objects to induce breakdown between the emitters and the target. For RC decay time at less than the time needed to induce breakdown, breakdown never occurs; therefore, the target will not be detected.

Both pulsed MC and ESD methods share the same challenge in terms of separating detection without pre-detonation from detection through pre-detonation. The challenge is to induce sufficient energy into the target to detect the IED without pre-detonating the explosive therein. For ESD systems, there are several orders of magnitude of difference in the induced energy into the target depending on where breakdown occurs on the wires (i.e., opposite side breakdown and same side breakdown).

The induced energy for magnetic fields in the exemplary MC system depends on the coupling coefficient between the target and the induction loop, which, in turn, depends on the layout of the target in reference to the induction loop. However, the challenge is more difficult to overcome with ESD systems than applicable for a magnetic system. Where breakdown occurs on the target cannot be controlled; however, the orientation of the Induction loop can be controlled to maximize the coupling coefficient. The distinction between detection and pre-detonation can be obviated using CW magnetic fields.

Metal detectors are by far the most common and well known device for detecting metallic objects within and IED, such as the pressure plate or the explosive cap. A metal detector produces a low power magnetic field with a coil. Any metal within the region of the produced magnetic field will generate eddy currents, thus producing their own magnetic fields. A separate coil on the metal detector is used to measure these magnetic fields produced from the eddy currents in the detected metal. The disadvantage of using a metal detector to detect IEDs constitutes the high number of false positives because its design to indicate any metal object. Also, metal detectors cannot detect the command wires of an IED due to their small surface area. The exemplary magnetic induction system can detect IED's through their command wire by monitoring the change in energy dissipated into the peaking circuit.

While certain features of the embodiments of the invention have been illustrated as described herein, many modifications, substitutions, changes and equivalents will now occur to those skilled in the art. If is, therefore, to be understood that the appended claims are intended to cover al such modifications and changes as fall within the true spirit of the embodiments.

What is claimed is:

1. A magnetic coupling (MC) circuit for detecting an obscured object, said MC circuit connecting to a current measuring instrument and comprising:
    a Marx bank having a plurality of stages, each stage including a resistor-capacitor (RC) loop having a first reactance device connecting to a breakdown circuit, said Marx bank connecting to a fixed potential known as ground, said breakdown circuit including a breakdown switch, a second reactance device and a bank capacitor;
    a voltage source connecting to said Marx bank;
    a peaking circuit including a peaking inductor, a peaking capacitor and a peaking switch disposed in parallel, said peaking inductor and peaking capacitor constituting a peaking circuit pair, said peaking switch connecting to said Marx bank; and
    an induction loop having an impedance inductor connecting to said peaking switch, wherein the instrument measures a first current in absence of the object and a second current in presence of the object, and detects the object based on difference between said first and second currents.

2. The MC circuit according to claim 1, wherein said first and second reactance devices are first and second resistors, respectively.

3. The MC circuit according to claim 1, wherein said first and second reactance devices are first and second inductors, respectively.

4. The MC circuit according to claim 1, wherein said voltage supply is a pulse power supply.

5. The MC circuit according to claim 4, wherein said Marx bank includes seven stages.

6. The MC circuit according to claim 1, wherein said voltage supply is a continuous wave source.

7. The MC circuit according to claim 1, wherein said peaking circuit pair is a concatenated plurality of peaking inductor and peaking capacitor pairs.

* * * * *